United States Patent
Becker et al.

[11] Patent Number: 5,886,929
[45] Date of Patent: Mar. 23, 1999

[54] HIGH SPEED ADDRESSING BUFFER AND METHODS FOR IMPLEMENTING SAME

[75] Inventors: Scott T. Becker; Steve P. Kornachuk, both of San Jose, Calif.

[73] Assignee: Artisan Components, Inc., Sunnyvale, Calif.

[21] Appl. No.: 837,611

[22] Filed: Apr. 21, 1997

[51] Int. Cl.⁶ .................................................. G11C 7/00
[52] U.S. Cl. ................ 365/189.05; 365/196; 365/230.08
[58] Field of Search ............................... 365/189.05, 196, 365/230.06, 230.08

[56] References Cited

U.S. PATENT DOCUMENTS

| | | | |
|---|---|---|---|
| 4,128,900 | 12/1978 | Lappington | 365/94 |
| 5,029,135 | 7/1991 | Okubo | 365/203 |
| 5,091,889 | 2/1992 | Hamano et al. | 365/233.5 |
| 5,146,427 | 9/1992 | Sasaki et al. | 365/189.05 |
| 5,214,609 | 5/1993 | Kato et al. | 365/230.01 |
| 5,311,471 | 5/1994 | Matsumoto et al. | 365/189.05 |
| 5,404,334 | 4/1995 | Pascucci et al. | 365/210 |
| 5,414,663 | 5/1995 | Komarek et al. | 365/210 |
| 5,459,689 | 10/1995 | Hikichi | 365/189.09 |
| 5,555,521 | 9/1996 | Hamada et al. | 365/185.03 |
| 5,561,629 | 10/1996 | Curd | 365/185.21 |
| 5,596,539 | 1/1997 | Passow et al. | 365/210 |
| 5,608,681 | 3/1997 | Priebe et al. | 365/207 |
| 5,625,586 | 4/1997 | Yamasaki et al. | 365/104 |
| 5,631,866 | 5/1997 | Oka et al. | 365/189.05 |
| 5,636,161 | 6/1997 | Mann | 365/185.21 |
| 5,654,919 | 8/1997 | Kwon | 365/185.21 |
| 5,661,693 | 8/1997 | Akioka et al. | 365/189.05 X |
| 5,694,369 | 12/1997 | Abe | 365/210 |
| 5,699,295 | 12/1997 | Yero | 365/185.21 |
| 5,751,649 | 5/1998 | Kornachuck et al. | 365/189.05 X |
| 5,761,131 | 6/1998 | Roohparvar | 365/189.05 X |

*Primary Examiner*—Do Hyun Yoo
*Attorney, Agent, or Firm*—Hickman & Martine, LLP

[57] ABSTRACT

Disclosed is an apparatus for generating a memory access signal. The apparatus includes a latch having a set state for driving a set transistor, and a reset state for driving a reset transistor. The latch having an input terminal and an output terminal, and the latch transitions between the set and reset states in accordance with a system clock signal. The apparatus further includes a driver coupled to the output terminal of the latch for producing an access signal, and feedback path for feeding back the access signal to the input terminal of the latch. Wherein the latch operates to switch from the set state to the reset state in accordance with the fed back access signal. In this manner, the system clock is isolated from the set transistor when the latch is already in the set state. Further, the latch operates to switch from the reset state to the set state in accordance with the fed back access signal, such that the system clock is isolated from the reset transistor when the latch is already in the reset state.

28 Claims, 10 Drawing Sheets

HIGH SPEED ADDRESSING BUFFER AND METHODS FOR IMPLEMENTING SAME

BACKGROUND OF THE INVENTION

1. Field of the Invention

The present invention relates generally to integrated circuits, and more particularly to methods and apparatuses for high speed addressable buffers for selecting addresses in memory devices.

2. Description of the Related Art

As is well known in the art, memory devices are generally array structures composed of $2^n$ by $2^m$ individual memory cells which are coupled to wordlines (rows) and complementary pair bit lines (columns). A typical memory cell may be composed of transistors coupled together to form a data storage device. An individual memory cell is typically selected when an X-decoder is used to select rows and a Y-decoder is used to select columns. A synchronous memory device utilizes a system clock $S_{CLK}$ to generate a clock signal $S_{CLK}$ to enable a selected address location to drive an output node to a state consistent with data stored in the selected memory cell location. As is well known in the art, in any synchronous memory device, the time delay between a falling edge or a rising edge of a clock signal $S_{CLK}$ and the true selected data available at the output node is a critically important performance parameter.

FIG. 1A is a block diagram illustrating conventional methods for selecting a specific wordline (i.e., $W_1 \ldots W_N$) from a core 100 in a synchronous memory device. In typical synchronous architectures, computers access memory core 100 through an address input bus 110 that may be coupled to a conventional X-decode address selector 102a, which is coupled to an X-decode buffer 102b, and a Y-decode address buffer (not shown). For ease of understanding, the Y-decode address buffer will not be described, however, the principles and concepts are generally applicable to all conventional addressable buffer configurations.

Typically, X-decode address selector 102a presents a pre-selected wordline address to the X-decode buffer 102b when signal clock $S_{CLK}$ makes a transition. By way of example, when clock signal $S_{CLK}$ transitions from either LOW to HIGH, or HIGH to LOW, the selected wordline is able to drive output 103 to a logical state consistent with digital data stored in the selected memory cell location. In other words, when a read operation is performed, a specific wordline address is decoded by the X-decode address selector 102a (once a Y address has already been selected), and presented to the X-decode buffer 102b. Once the clock signal $S_{CLK}$ produces a rising edge, the X-decode buffer 102b is triggered, thereby enabling the selected wordline to drive output 103 to a logic state consistent with digital data stored in the selected memory core cell location.

Unfortunately, the above-described X-decode buffer configuration may have slow data access times that may be unsuitable for speed sensitive applications. That is, typical X-decode buffer configurations introduce speed reducing propagation delays as well as high input capacitances that detrimentally impact clock signal $S_{CLK}$ drivers. Because data access times are typically measured in terms of the rise or fall times experienced by the clock signal $S_{CLK}$, it is advantageous to reduce the input capacitance as well as reducing propagation delays. Unfortunately, typical X-decode buffers tend to introduce clock signal $S_{CLK}$ input capacitances that are up to about 30 pF and propagation delays that are approximately equivalent up to about 5 gate delays or more.

FIGS. 1B and 1C illustrate exemplary prior art attempts at decreasing data access times in synchronous memory devices. FIG. 1B illustrates a prior art attempt at reducing synchronous memory data access times by reducing clock input capacitance. In this example, the size of an input driver (I1) is decreased to reduce the input capacitance experienced by clock signal $S_{CLK}$. Unfortunately, reducing the size of input driver (I1) necessarily reduces its drive capacity which in turn necessitates an offsetting increase in the number of inverter stages $INV_N$ (where N is even).

In other words, because the input driver (I1) is reduced in strength, a plurality of delay producing inverters must be incorporated to produce a drive strength that is sufficient to drive an output buffer (B1). As such, the increased number of inverter stages ($INV_N$), adds gate delays to the overall data access time of the synchronous memory device. As a side effect, the increased delays cancel out the enhancements in speed associated with the reduction in clock input capacitance.

FIG. 1C illustrates another prior art attempt at reducing access times in synchronous memory devices. In this configuration, the inverter stages of FIG. 1B are eliminated, which beneficially provides a reduction in access delays. However, removing the inverter stages requires that substantially all of the drive current for output driver (B2) be supplied by the input driver (I2). As a result, the high drive input driver (I2) will generate a large input capacitance for clock signal $S_{CLK}$, thereby erasing any benefit provided by having less gate delays.

Unfortunately, in applications using synchronous memory devices where data access times are of critical importance, the slow response of X-decode buffers may disadvantageously limit a system's overall performance. For example, although Central Processing Unit (CPU) system clock speeds have continually increased in recent years, memory access operations are a necessity when performing data reads from memory. As can be appreciated, the slowest operation in a CPU/memory interface will ultimately determine a system's overall processing performance. It is thus important that delays associated with performing memory access operations be reduced to prevent more global system delays.

In view of the foregoing, there is a need for methods and apparatuses for providing high speed memory access circuitry. In particular, there is a need for addressable high speed buffer circuitry that enables memory access operations to occur at higher speeds.

SUMMARY OF THE INVENTION

Broadly speaking, the present invention relates to a high speed addressable buffer circuit architecture in which input capacitance seen by a system clock is advantageously reduced. The various embodiments of the present invention may be implemented in many forms, and find particular use in accessing memory operations. However, it should be appreciated that the present invention may be implemented in numerous ways, including as a process, an apparatus, a system, a device, or a method. Several inventive embodiments of the present invention are described below.

In one embodiment, an apparatus for generating a memory access signal is disclosed. The apparatus includes a latch having a set state for driving a set transistor, and a reset state for driving a reset transistor. The latch having an input terminal and an output terminal, and the latch transitions between the set and reset states in accordance with a system clock signal. The apparatus further includes a driver coupled to the output terminal of the latch for producing an access signal, and feedback path for feeding back the access signal to the input terminal of the latch. Wherein the latch operates to switch from the set state to the reset state in accordance with the fed back access signal. In this manner, the system clock is isolated from the set transistor when the latch is already in the set state. Further, the latch operates to switch from the reset state to the set state in accordance with the fed back access signal, such that the system clock is isolated from the reset transistor when the latch is already in the reset state.

In another embodiment, a high speed memory addressing circuit is disclosed. The high speed memory includes a latching circuit configured to generate a first latched signal from an output node that is coupled to a first driver transistor in response to a first system clock transition. A first output feedback inverter is configured to receive the first latched signal and output the first latched signal as an inverted first latched signal. A setting circuit is configured to receive the inverted first latched signal. The setting circuit is further configured to disable the first driver transistor in response to receiving the inverted first latched signal. The high speed memory further includes a second output feedback inverter for receiving the inverted first latched signal. The second output feedback inverter is configured to enable a second driver transistor at a second system clock transition to produce a second latched signal at the output node after the first driver transistor is disabled.

In yet another embodiment, a method for accessing memory locations is disclosed. The method includes generating a first latched signal in response to a first system clock transition. The first latched signal is output from a node coupled to a first transistor to access an address in a memory core. The method further includes supplying a first feedback signal configured to disable the first transistor and substantially simultaneously enable a second transistor after the first system clock transition, further, generating a second latched signal in response to a second clock transition. The second latched signal is output from the node coupled to a second transistor to isolate the memory core, and further supplying a second feedback signal configured to disable the second transistor and substantially simultaneously enable the first transistor after the second system clock transition.

Several advantageous features are therefore disclosed which includes providing high speed memory addressing circuitry that substantially reduces the input capacitance seen by a system clock. Further, the input capacitance seen by the system clock is also reduce by isolating all de-selected address lines from the system clock during an addressing operation. Yet another advantageous feature includes providing a short pulse to the driving transistors within the addressing circuitry to further reduce input capacitance. Other aspects and advantages of the invention will become apparent from the following detailed description, taken in conjunction with the accompanying drawings, illustrating by way of example the principles of the invention.

BRIEF DESCRIPTIONS OF THE DRAWINGS

The present invention will be readily understood by the following detailed description in conjunction with the accompanying drawings, wherein like reference numerals designate like structural elements, and in which.

DETAILED DESCRIPTION OF THE PREFERRED EMBODIMENTS

An invention for a high speed addressing buffer architecture in which input capacitance seen by a system clock is advantageously reduced is disclosed. The various embodiments of the present invention may be implemented in any form, and may find particular use in high speed access of data in memory output operations. In the following description, numerous specific details are set forth in order to provide a thorough understanding of the present invention. It will be obvious, however, to one skilled in the art, that the present invention may be practiced without some or all of these specific details. In other instances, well known process operations have not been described in detail in order not to unnecessarily obscure the present invention.

Figure 1A:
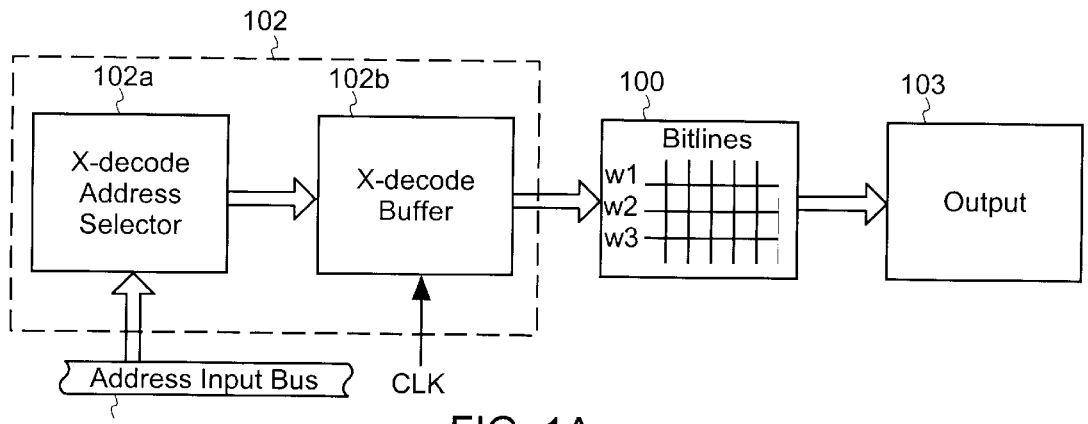
FIG. 1A illustrates a conventional synchronous memory addressing block diagram for an X-decoder used for outputting digital data stored within a memory core.
Figure 1B:
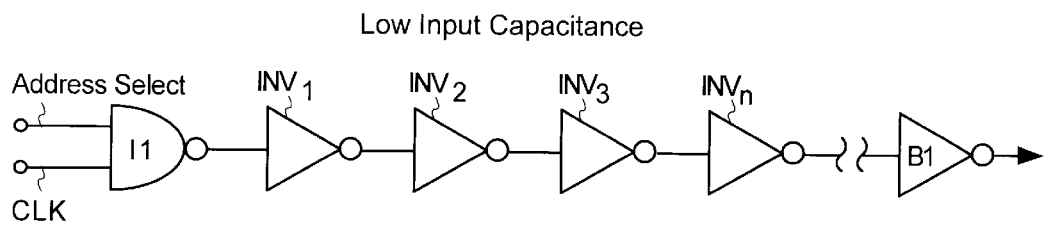
FIG. 1B illustrates conventional output buffer circuitry including a low input capacitance X-decoder having N inverter stages.
Figure 1C:
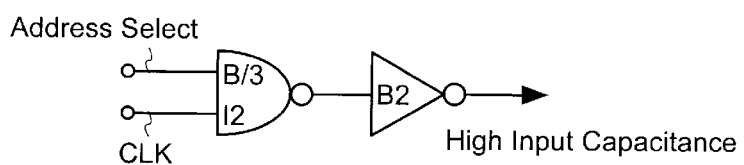
FIG. 1C illustrates conventional output buffer circuitry including a high input capacitance high current drive X-decoder.
Figure 2:
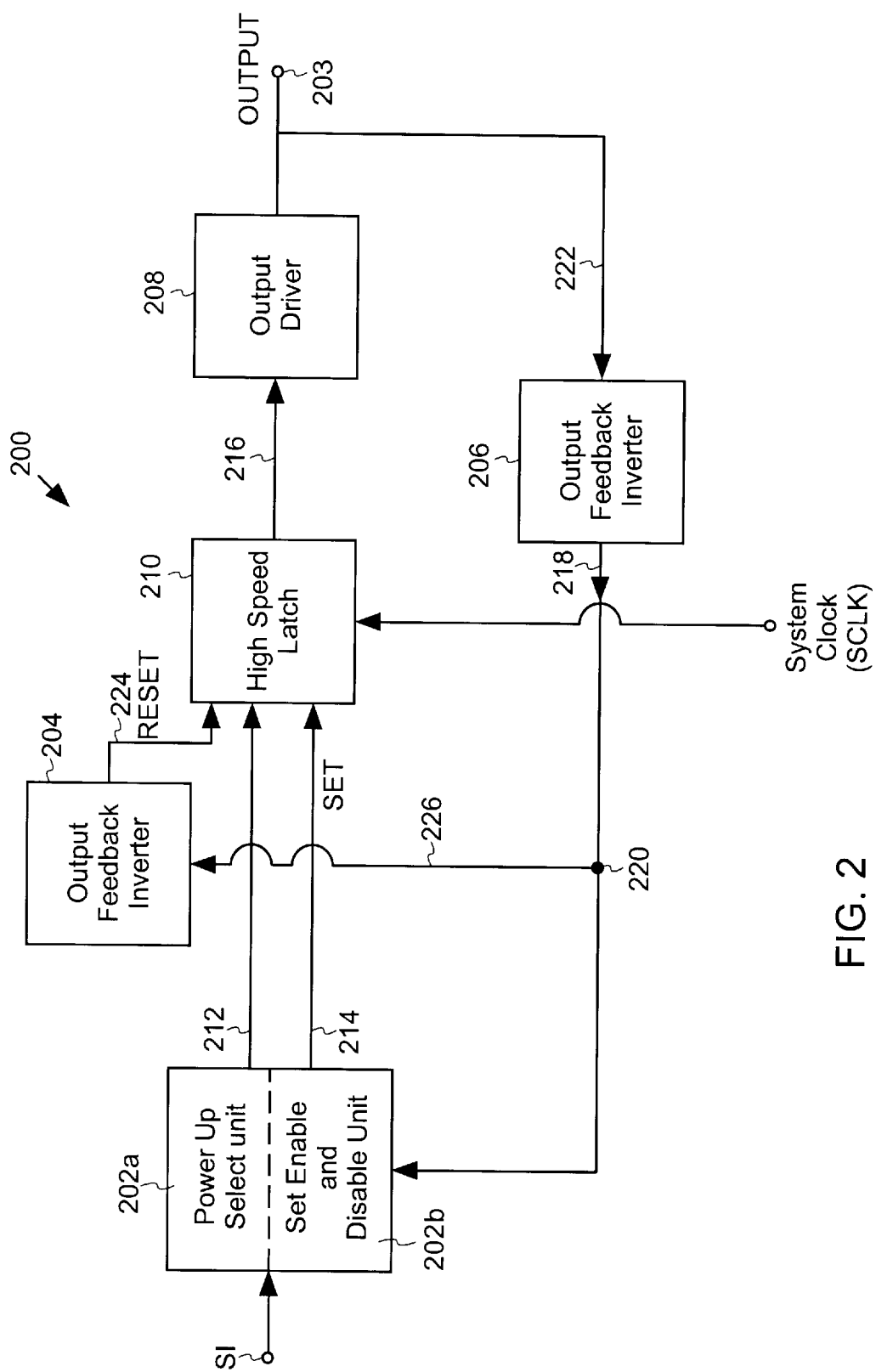
FIG. 2 illustrates an overview functional diagram of a testable high speed addressable buffer architecture in accordance with one embodiment of the present invention.

FIG. 2 shows an overview functional diagram of a testable high speed addressable buffer architecture 200 in accordance with one embodiment of the present invention. Architecture 200 generally includes a power up select unit 202a, a SET enable and disable unit 202b for enabling and disabling a SET function of high speed latch 210. A SET function is preferably defined as setting a data latch to a preset logic state. High speed latch 210 also receives a RESET function from an output feedback inverter 204. A RESET function is preferably defined as setting a data latch to a complementary preset logic state.

In general, the SET and RESET functions are preferably controlled by either a rising or falling edge of a clock signal $S_{CLK}$. Architecture 200 also includes an output driver circuit 208 that receives an input from high speed latch 210 and provides an output 203. From the output 203, a feedback signal is provided to an output feedback inverter 206. In this manner, output feedback inverter 206 provides an inverted signal to the SET enable and disable unit 202b and output feedback inverter 204. Once output feedback inverter 204 receives the signal from output feedback inverter 206, the inverted feedback signal will be input to high speed data latch 210.

In this embodiment, only one combination of high speed latch 210, power up select unit 202a, SET enable and disable unit 202b, output feedback inverter 204, output driver circuit 208, and output feedback inverter 206 is shown for ease of description. Although this exemplary combination is preferably implemented for accessing a single address location in a memory array, it should be understood that architecture 200 may be replicated any number of (N) times depending on the requirements of a particular memory output design. By way of example, if a 16-bit wide, 32-bit wide, or an N-bit wide output is desired, architecture 200 may be replicated 16 times, 32 times or N times, respectively.

Figure 6A:
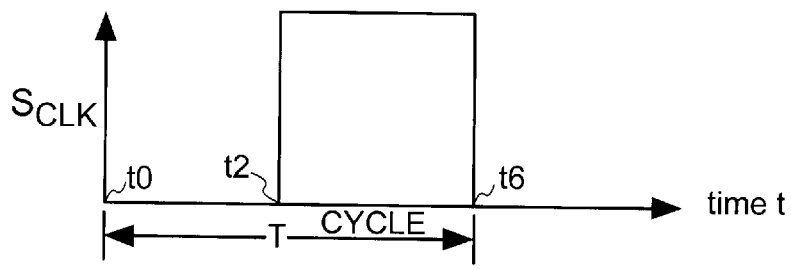
FIG. 6A is a graphical representation of a typical clock cycle in accordance with one embodiment of the present invention.

In this embodiment, a typical clock cycle preferably has a period equal to a duration of time $t=t_6$ minus (−) time $t=t_0$, (i.e., T) as shown in FIG. 6A. The typical clock CYCLE may also be viewed as clock signal $S_{CLK}$ being LOW (i.e., where a system clock CLK generates a low rail voltage (Vss) signal) for a duration of time equal to time $t=t_2-t_0$, followed by a clock signal $S_{CLK}$ HIGH (i.e., where the system clock CLK generates a high rail voltage (Vdd) signal) for a duration of time equal to time $t=t_6-t_2$.

At the beginning of the typical clock cycle (i.e., at time $t=t_0$), the SET and RESET functions of high speed latch 210 are disabled. Further, at time $t=t_0$, output 203 is preferably LOW as shown in FIG. 6C. When output 203 is LOW, line 222 will also be LOW, since line 222 is electrically coupled to output 203 as shown in FIG. 4C. Line 222 also defines an input to output feedback inverter 206. Accordingly, line 222 going LOW forces output feedback inverter 206 to drive line 218 HIGH. Line 218 going HIGH preferably enables SET enable and disable unit 202b.

Figure 6B:
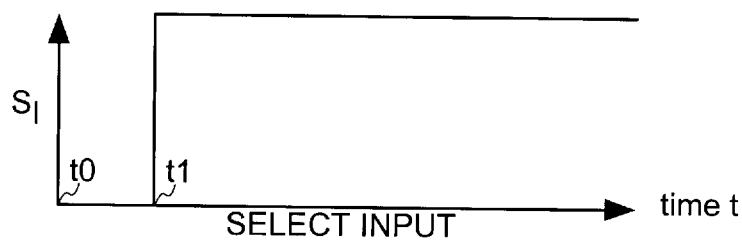
FIG. 6B is a graphical representation of a waveform for select input signal $S_I$ for a selected wordline in accordance with one embodiment of the present invention.
Figure 6C:
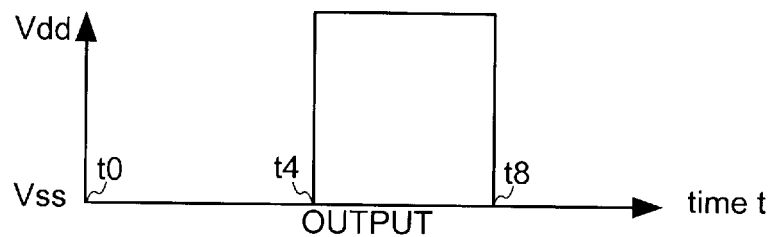
FIG. 6C is a graphical representation of a waveform for an output node in accordance with one embodiment of the present invention.

Referring to FIG. 6B, when a wordline is selected, select input signal $S_I$ goes HIGH at a time $t=t_1$, forcing SET enable and disable unit 202b (that is currently enabled) to drive line 214 LOW. Line 214 going LOW preferably enables the SET function of high speed latch 210. When the SET function of high speed latch 210 is enabled, system clock CLK is capable of driving output 203 HIGH by generating clock signal $S_{CLK}$ HIGH. In other words, high speed latch 210 will remain in its enabled state ready to output a LOW on line 216 and a HIGH at output 203 when clock signal $S_{CLK}$ goes HIGH.

As clock signal $S_{CLK}$ goes HIGH at a time $t=t_2$, as shown in FIG. 6A, high speed latch 210 that is currently enabled drives output 203 HIGH at a time $t=t_4$, as shown in FIG. 6C. Since line 222 is electrically coupled to output 203, line 222 will also go HIGH which forces output feedback inverter 206 to drive line 218 LOW. Line 218 going LOW forces the SET enable and disable unit 202b to drive line 214 HIGH. Line 214 going HIGH preferably disables the SET function of high speed latch 210. When the SET function of high speed latch 210 is disabled, system clock CLK is incapable of driving output 203 HIGH.

Since line 226 is electrically coupled to line 218 at node 220, line 226 goes LOW when line 218 goes LOW. As described above, line 226 also defines an input to output feedback inverter 204. In this manner, line 226 going LOW forces output feedback inverter 204 to drive line 224 HIGH. Line 224 going HIGH preferably enables the RESET function of high speed latch 210. When the RESET function high speed latch 210 is enabled, system clock CLK is capable of driving output 203 LOW by generating clock signal $S_{CLK}$ LOW.

By way of example, when clock signal $S_{CLK}$ goes LOW at a time $t=t_6$ (i.e., completing the typical clock cycle) as shown in FIG. 6A, high speed latch 210 that is currently RESET enabled drives output 203 LOW at a time $t=t_8$, as shown in FIG. 6C. Since line 222 of FIG. 2 is electrically coupled to output 203, line 222 will also go LOW at a time $t=t_8$. Line 222 going LOW will force output feedback inverter 206 to drive line 218 HIGH. Line 218 going HIGH forces the SET enable and disable unit 202b to drive line 214 LOW. Line 214 going LOW preferably enables the SET function of high speed latch 210. At this point, the circuit is back to its initial state where it is waiting for another HIGH clock signal $S_{CLK}$ which may be received during a new cycle.

As described above, line 226 defines the input for output feedback inverter 204 and is electrically coupled to line 218 at node 220. Line 218 going HIGH drives line 226 HIGH forcing output feedback inverter 204 to drive line 224 LOW. Line 224 going LOW preferably disables the RESET function of high speed latch 210.

As can be appreciated, the SET function of high speed latch 210 is enabled when the RESET function of high speed latch 210 is disabled, and vice-versa. Therefore, system clock CLK is preferably coupled to a single output transistor at one time as will be described with reference to FIG. 5 below. Advantageously, system clock CLK is only required to drive the gate capacitance of a single output transistor in high speed latch 210 which speeds up memory accessing operations.

Figure 3:
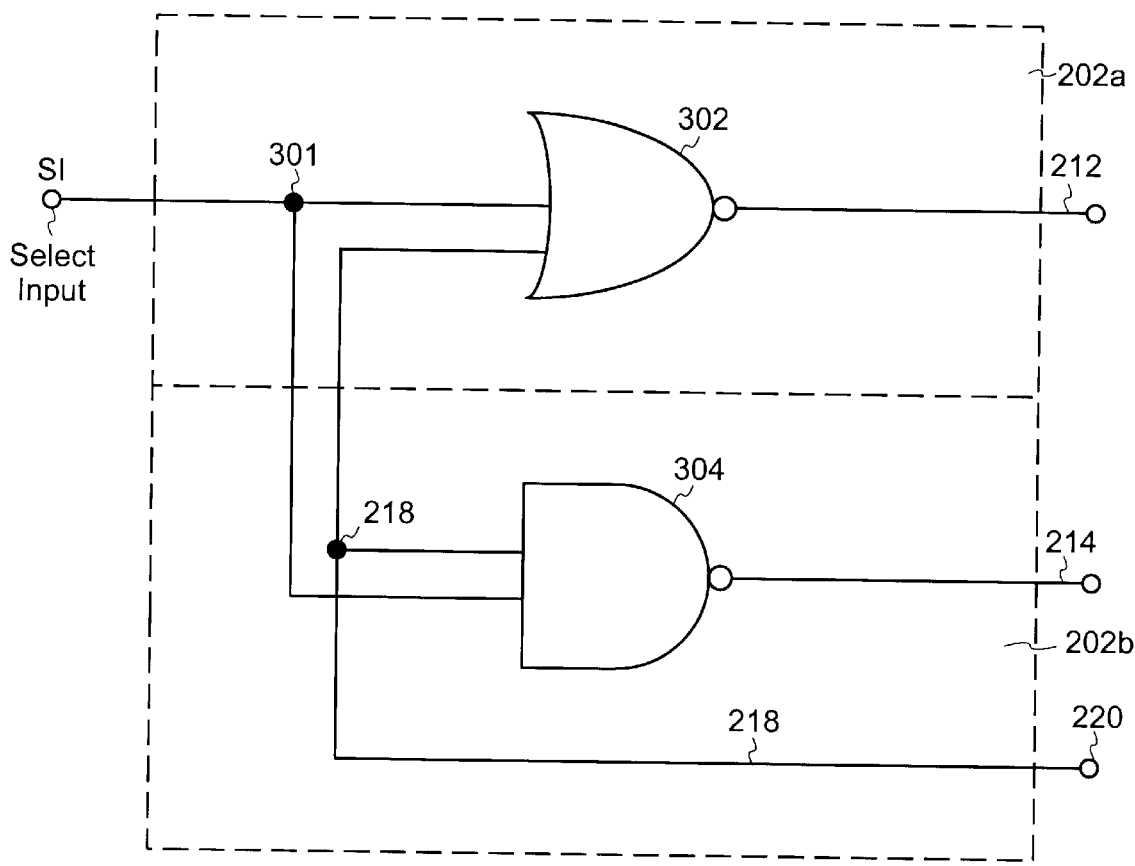
FIG. 3 is a graphical representation illustrating preferred logic connections contained within a power up select unit and a SET enable and disable unit in accordance with one embodiment of the present invention.

FIG. 3 is a circuit representation of the functional interconnections for power up select unit 202a and SET enable and disable unit 202b. In operation, the power up select unit 202a is generally used during power up sequences to ensure that de-selected wordlines are not driving outputs to the HIGH state. Since the state of high speed latch 210 is unknown at an initial power up state, the power up select unit 202a ensures that all de-selected wordlines preferably drive outputs (output 203) to the LOW state.

By way of example, if a select input signal $S_I$ is HIGH (i.e., indicating a selected wordline), power up select unit 202a is disabled. That is, $S_I$=HIGH is passed as an input to a NOR gate 302 and a NAND gate 304, while a LOW communicated along line 218 is also passed as an input to NOR gate 302 and NAND gate 304. Alternatively, when select input signal $S_I$ is LOW (i.e., indicating a de-selected wordline) and output 203 of FIG. 2 is HIGH, then power up select unit 202a preferably drives line 212 HIGH, thereby forcing high speed latch 210 to drive output 203 LOW. That is, both nodes of NOR gate 302 and NAND gate 304 receive LOW signals thereby placing line 212 in a HIGH state.

For this embodiment, the initial power up sequence is complete when power up unit 202a has ensured that all de-selected wordlines (i.e. $S_I$ is LOW, as shown in FIG. 6B) are driving associated outputs that are LOW at a time $t=t_0$, as shown in FIG. 6C. Referring again to FIG. 3, the SET enable and disable unit 202b enables the SET function of the high speed latch 210 by driving line 214 LOW when both select input signal $S_I$ is HIGH (i.e., indicative of a selected wordline) and line 218 is HIGH (i.e., indicative of a low drive output 203).

Figure 4A:
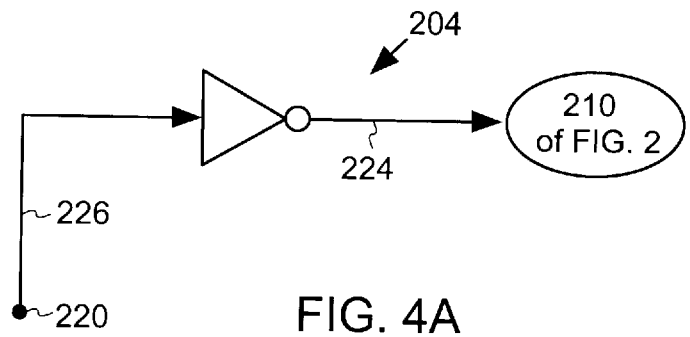
FIG. 4A is a circuit representation illustrating an output feedback inverter in accordance with one embodiment of the present invention.

FIG. 4A is a circuit representation of output feedback inverter 204. In this embodiment, output feedback inverter 204 operates to phase invert a signal input by line 226 that is coupled to node 220, and thereafter drive an output defined by line 224. Preferably, line 224 defines an input to high speed latch 210.

Figure 4B:
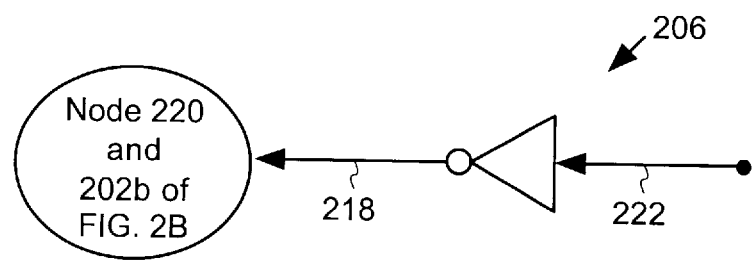
FIG. 4B is a circuit representation illustrating an output driver in accordance with one embodiment of the present invention.
Figure 4C:
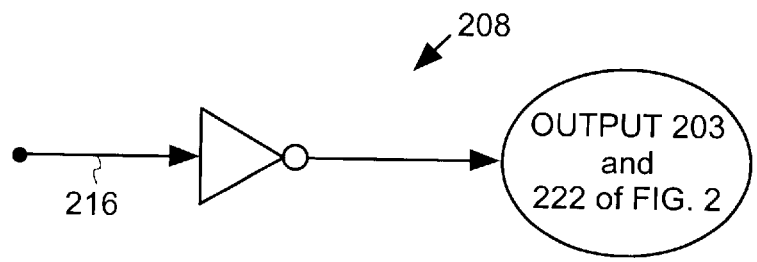
FIG. 4C is a circuit representation illustrating an output feedback inverter in accordance with one embodiment of the present invention.

FIG. 4B is a circuit representation of output feedback inverter 206. In this embodiment, output feedback inverter 206 operates to phase invert a signal input by line 222, and thereafter drive line 218 which is coupled to node 220. Line 218 preferably defines an input to SET enable and disable unit 202b.

FIG. 4C is a circuit representation of output driver 208. In this embodiment, output driver 208 operates to phase invert a signal input by line 216, and thereafter substantially simultaneously drive output 203 and line 222.

Figure 5:
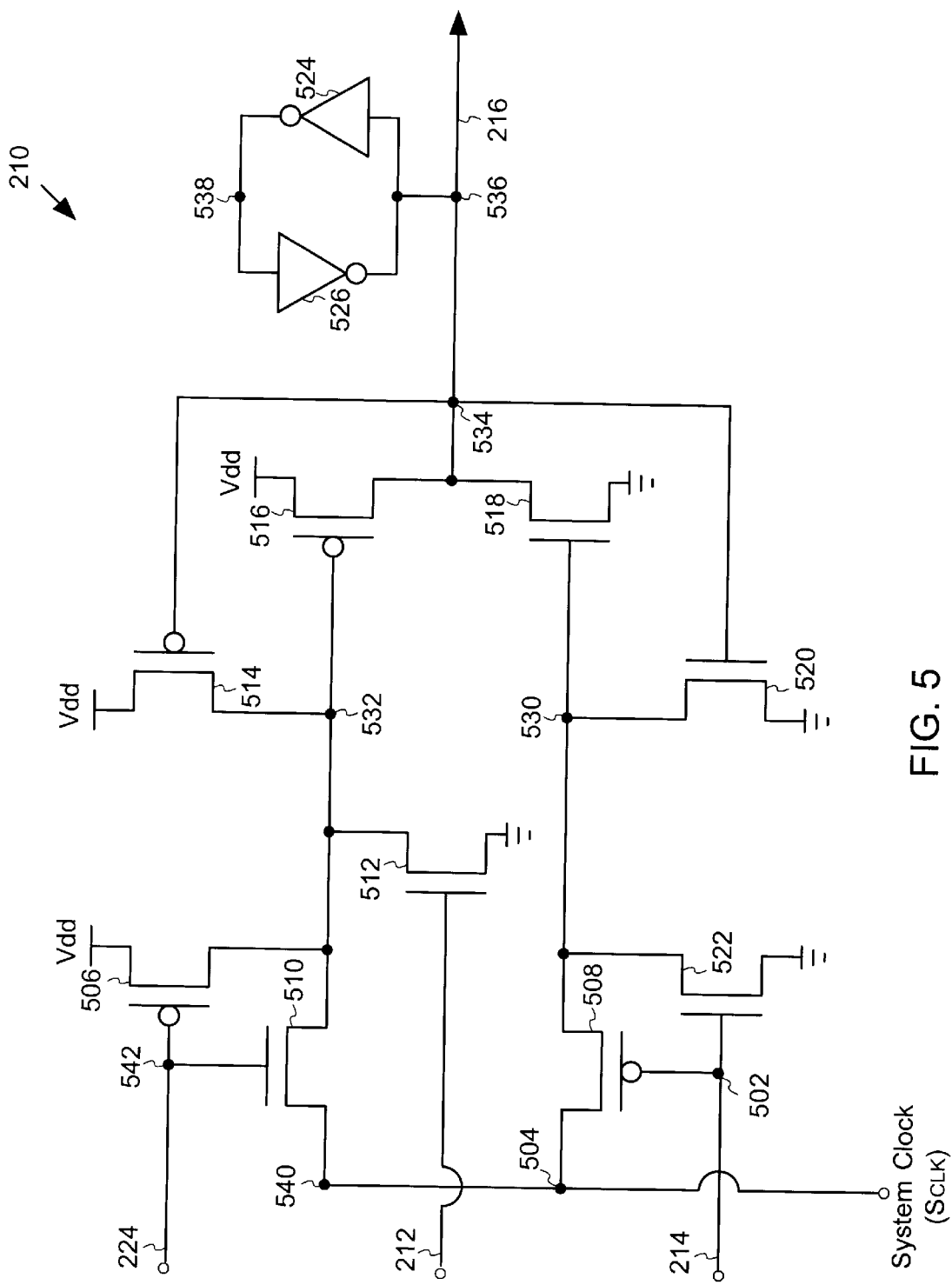
FIG. 5 is a circuit diagram illustrating preferred electrical interconnections contained within a high speed latch circuit in accordance with one embodiment of the present invention.

FIG. 5 is a circuit diagram illustrating preferred electrical interconnections contained within high speed latch 210 in accordance with one embodiment of the present invention. As shown, an n-channel transistor 522 has a gate connected to a node 502, a source connected to a node 530, and a drain connected to a low rail voltage Vss. A p-channel transistor 508 has a gate connected to a node 502, a source connected to a node 504, and a drain connected to a node 530, while an n-channel transistor 520 has a gate connect to a node 534, a source connected to node 530, and a drain connected to a low rail voltage Vss.

In this embodiment, a p-channel transistor 514 has a gate connected to node 534, a source connected to a high rail voltage Vdd, and a drain connected to a node 532. In one embodiment, p-channel transistor 514 may be omitted if a more compact design is desired. Preferably, a p-channel transistor 506 has a gate connected to a node 542, a source connected to high rail voltage Vdd, and a drain connected to node 532. An n-channel transistor 510 has a gate connected to node 542, a source connected to a node 540 and a drain connected to node 532. Preferably, an n-channel transistor 512 has a gate connected to line 212, which defines an output from power up select unit 202a, a source connected to node 532, and a drain connected to low rail voltage Vss. An n-channel transistor 518 has a gate connected to node 530, a source connected to node 534, and a drain connected to low rail voltage Vss. A p-channel transistor 516 has a gate connected to node 532, a source connected to high rail voltage Vdd, and a source connected to node 534.

A SET/RESET latch inverter 524 has an input defined by node 536 and an output defined by a node 538, while a SET/RESET latch inverter 526 has an input defined by node 538 and an output defined by node 536. Line 224 which defines an output of output feedback inverter 204 is preferably connected to the gates of transistors 506 and 510 at node 542. In this embodiment, line 214 defines an output of SET enable and disable unit 202b which is preferably connected to the gates of transistors 522 and 508 at node 502. System clock CLK is electrically connected to node 504 and a node 540 that is electrically identical to node 504.

In operation, the initial power up sequence is complete at time $t=t_0$, when power up unit 202b has ensured that all de-selected wordlines (i.e., $S_I$ is LOW, as shown in FIG. 6B) are driving outputs that are LOW as shown in FIG. 6C. In other words, a typical clock cycle is initiated when clock signal $S_{CLK}$ is LOW at time $t=t_0$ as shown in FIG. 6A.

As illustrated in FIG. 6B, when a wordline is selected, select input signal SI goes HIGH at a time $t=t_1$. Select input signal SI going HIGH forces the SET enable and disable unit 202b to drive line 214 LOW. Line 214 going LOW turns transistor 522 OFF and turns transistor 508 ON. Transistor 508 going ON preferably enables the SET function of high speed latch 210 by coupling system clock CLK at node 504 to the gate of transistor 518. In order to preserve functional integrity, transistor 518 must be kept OFF until a time $t=t_2$ (e.g., when $S_{CLK}$ goes HIGH) as shown in FIG. 6A. Advantageously, transistor 518 is kept OFF by transistor 520 (i.e., transistor 520 functions as a keeper). In this embodiment, the source of transistor 520 is preferably connected to the gate of transistor 518 at node 530. The gate of transistor 520 is preferably connected to the source of transistor 518 at node 534. Node 534 also defines an input to output driver 208 of FIG. 2. Node 534 is HIGH when output 203 is LOW at time $t=t_0$. Node 534 being HIGH turns transistor 520 ON. Accordingly, when transistor 520 is ON, the gate of transistor 518 is pulled to a low rail voltage Vss, thereby turning transistor 518 OFF.

As can be appreciated, for a single selected wordline, system clock CLK at node 504 is only required to drive the gate capacitance of transistor 518 when the SET function of high speed latch 210 is enabled. All de-selected wordlines are therefore isolated from the gate capacitance of transistor 518 as well as transistor 516.

Figure 6D:
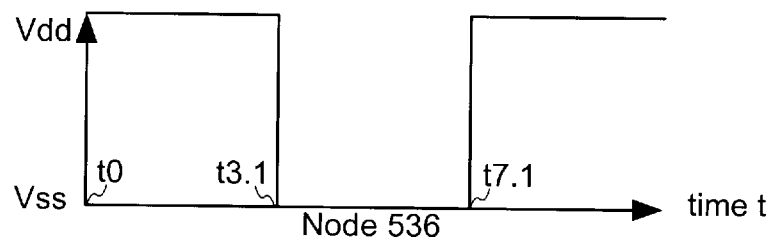
FIG. 6D is a graphical representation of a waveform for the Set/Reset Latch output node in accordance with one embodiment of the present invention.
Figure 6E:
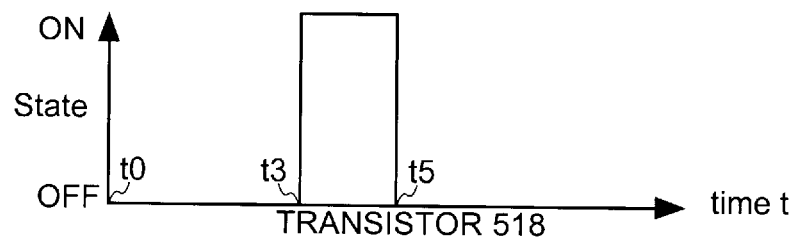
FIG. 6E is a graphical representation of a waveform for a pull down transistor in accordance with one embodiment of the present invention.

When the SET function of high speed latch 210 is enabled (i.e., clock signal $S_{CLK}$ going HIGH at a time $t=t_2$, as shown in FIG. 6A), transistor 518 turns ON at a time $t=t_3$ as shown in FIG. 6E. This is possible because transistor 508 has a greater current drive than transistor 520. Transistor 518 going ON then pulls node 534 to low rail voltage Vss forcing SET/RESET latch inverters 524 and 526 to store a LOW on node 536 at approximately a time $t=t_{3.1}$, as shown in FIG. 6D. Node 534 going to low rail voltage Vss advantageously turns transistor 520 OFF and forces output driver 208 (of FIG. 2) to drive output 203 HIGH at a time $t=t_4$, as shown in FIG. 6C.

Output 203 going HIGH drives line 222 (of FIG. 2) HIGH since line 222 is electrically coupled to output 203. Line 222 going HIGH therefore forces output feedback inverter 206 to drive line 218 LOW. Line 218 going LOW forces SET enable and disable unit 202b to drive line 214 HIGH, which turns transistor 508 OFF and transistor 522 ON. When transistor 522 is ON and transistor 508 is OFF, the SET function of high speed latch 210 is disabled. By way of example, the SET function of high speed latch 210 is disabled by de-coupling system clock CLK at node 504 from the gate of transistor 518.

When transistor 522 goes ON, node 530 is pulled to low rail voltage Vss which turns OFF transistor 518 at a time t=$t_5$. Transistor 518 going OFF at time t=$t_5$ creates a transistor pulse having a width of time t=time $t_5$ minus (−) time $t_3$, as shown in FIG. 6E. Advantageously, the transistor pulse facilitates a high speed output transition at node 534 by substantially eliminating crowbar current and thereby maximizes the available output current drive of transistor 518.

Although transistor 518 is OFF at time t=$t_5$, as shown in FIGS. 6C and 6D, SET/RESET latch inverters 524 and 526 keep node 534 at low rail voltage Vss. Node 534 being LOW forces output driver 208 (of FIG. 2) to keep output 203 HIGH while transistor 518 is OFF subsequent to time t=$t_5$.

Output feedback inverter 206 of FIG. 2 drives line 218 and line 226 LOW when output 203 and line 222 are HIGH. Line 226 going LOW forces output feedback inverter 204 to drive line 224 HIGH, thereby substantially simultaneously turning OFF transistor 506 and turning ON transistor 510. As a result of transistor 510 going ON and transistor 506 going OFF, the RESET function of high speed latch 210 is preferably enabled by coupling the system clock CLK at node 540 to the gate of transistor 516. In order to preserve functional integrity, transistor 516 must be kept OFF, until a time t=$t_6$ (e.g., when $S_{CLK}$ goes LOW) as shown in FIG. 6A. Advantageously, transistor 516 is kept OFF by transistor 514. In this embodiment, the drain of transistor 514 is preferably connected to the gate of transistor 516 at node 532. The gate of transistor 514 is preferably connected to the drain of transistor 516 at node 534. Node 534 also defines the input to output driver 208 of FIG. 2. As described above, node 534 is preferably LOW when output 203 is HIGH at time t=$t_4$. Node 534 being LOW ensures that transistor 514 ON. Accordingly, when transistor 514 is ON, the gate of transistor 516 is pulled to high rail voltage Vdd, thereby turning transistor 516 OFF.

As can be appreciated, for a single selected wordline, the system clock CLK at node 540 is only required to drive the gate capacitance of transistor 516 when the RESET function of high speed latch 210 is enabled. Advantageously, all de-selected wordlines are isolated from the large gate capacitance of transistor 516 as well as transistor 518.

Figure 6F:
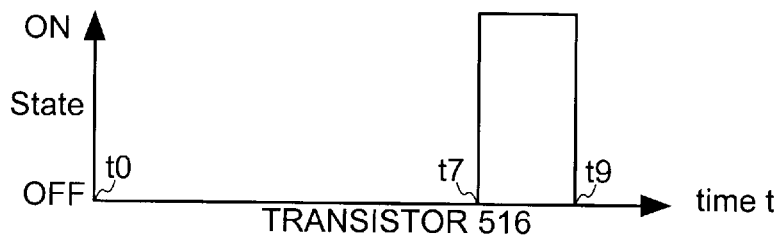
FIG. 6F is a graphical representation of a waveform for a pull up transistor in accordance with one embodiment of the present invention.

When the RESET function of high speed latch 210 is enabled, clock signal $S_{CLK}$ going LOW at a time t=$t_6$, as shown in FIG. 6A, turns transistor 516 ON at a time t=$t_7$ as shown in FIG. 6F. This is possible because transistor 510 has a greater current drive than transistor 514. Transistor 516 going ON pulls node 534 to high rail voltage Vdd, which forces SET/RESET latch inverters 524 and 526 to store a HIGH on node 536 at approximately a time t=$t_{7-1}$, as shown in FIG. 6D. Node 534 going to high rail voltage Vdd advantageously turns transistor 514 OFF, and forces output driver 208 of FIG. 2 to drive output 203 LOW at a time t=$t_8$, as shown in FIG. 6C. Output 203 going LOW drives line 222 LOW since line 222 is electrically coupled to output 203. Line 222 going LOW forces output feedback inverter 206 to drive lines 218 and 226 HIGH.

Line 226 also defines the input to output feedback inverter 204. Line 226 going HIGH forces output feedback inverter 204 to drive line 224 LOW. Line 224 going LOW substantially simultaneously turns transistor 506 ON and transistor 510 OFF. Transistor 510 going OFF preferably disables the RESET function of high speed latch 210 by de-coupling system clock CLK at node 540 from the gate of transistor 516.

When transistor 506 goes ON, node 532 is pulled to high rail voltage Vdd which turns OFF transistor 516 at a time t=$t_9$. Transistor 516 going OFF at a time t=$t_9$ creates a transistor pulse having a width of time t=time $t_9$ minus (−) time $t_7$, as shown in FIG. 6F. The transistor pulse facilitates a high speed output transition at node 534 by substantially eliminating crowbar current between transistors 516 and 518. As a result of eliminating crowbar current, substantially more current drive is available to drive output node 534.

Although transistor 516 is OFF at time t=$t_9$, as shown in FIG. 6C and 6D, SET/RESET latch inverters 524 and 526 keep node 534 at high rail voltage Vdd. Node 534 being HIGH forces output driver 208 (of FIG. 2) to keep output 203 LOW while transistor 516 is OFF subsequent to time t=$t_9$.

Line 218 going HIGH also forces SET enable and disable unit 202b to drive line 214 LOW, which turns transistor 522 OFF and transistor 508 ON. When transistor 522 is OFF and transistor 508 is ON, the SET function of the high speed latch 210 is again preferably enabled. At this point, the entire SET and RESET cycle may be repeated for a new selected wordline. Of course, the above described embodiments may be applied to bitlines or any addressable memory device.

Figure 7:
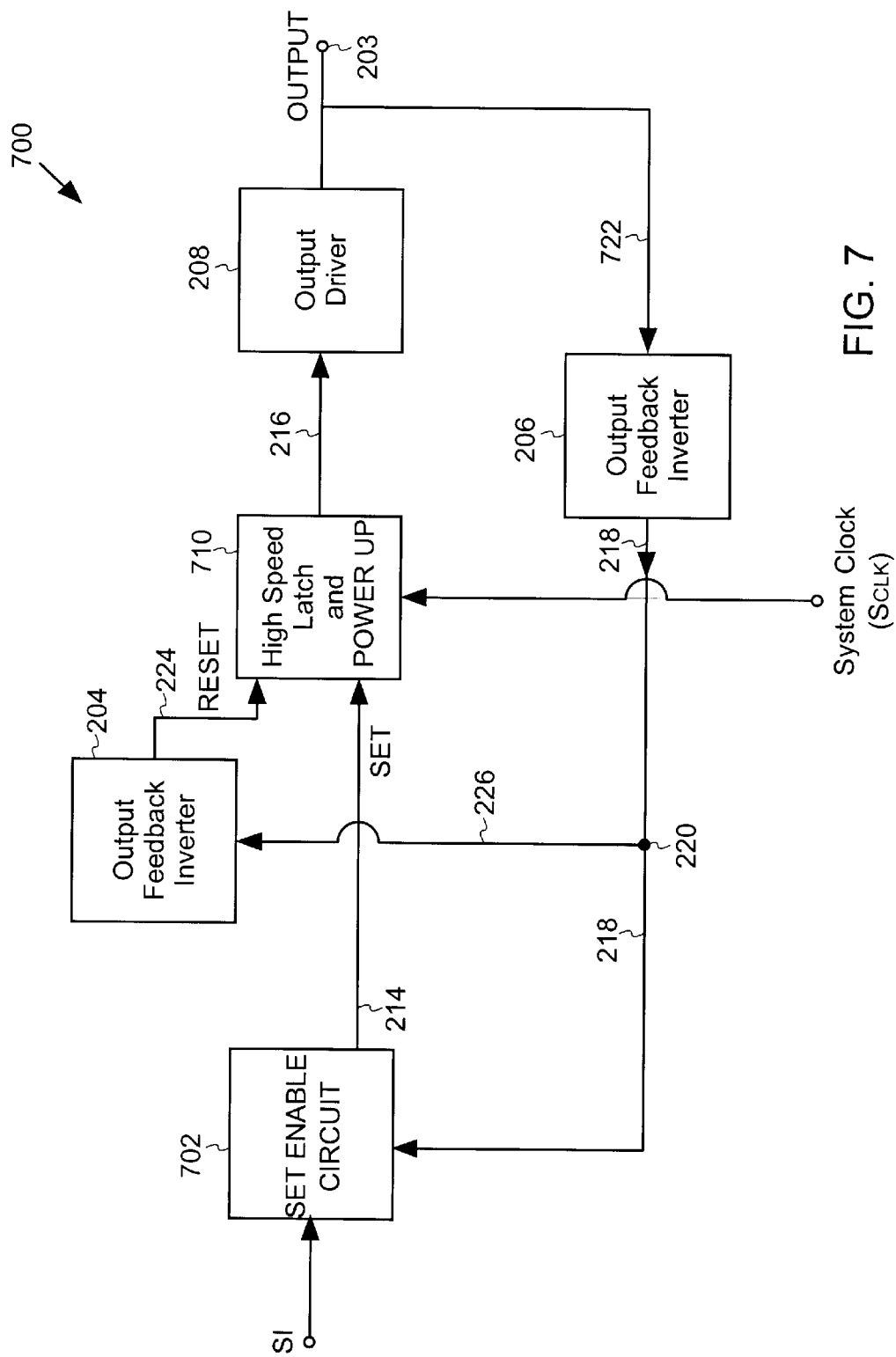
FIG. 7 is an overview functional diagram of a high speed addressable buffer architecture in accordance with an alternative embodiment of the present invention.

FIG. 7 is an overview functional diagram of a high speed addressable buffer architecture 700 in accordance with an alternative embodiment of the present invention. In this embodiment, a simple set enable circuit 702 is used to supply a SET signal to a high speed latch and power up block 710. As described above, the SET signal enables high speed latch and power up block 710 when the SET signal supplies a LOW. In this embodiment, the power up functions performed in power up select unit 202a of FIG. 2 have been modified into a more compact circuit layout. By way of example, the power up functions for high speed addressable buffer architecture 700 are now performed within high speed latch and power up block 710. The power up functions will be described in greater detail below in FIGS. 9 through 11.

Figure 8:
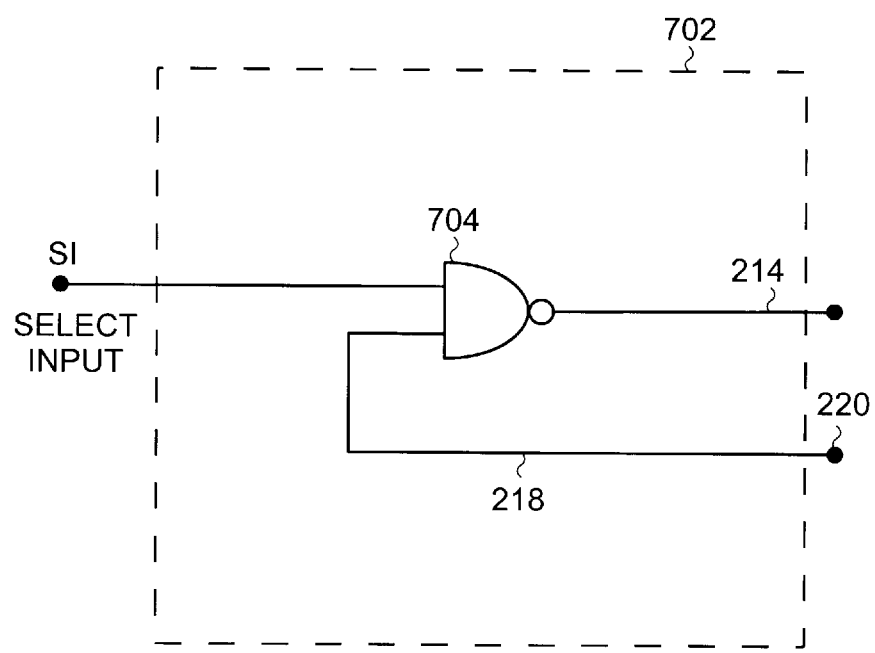
FIG. 8 is a circuit diagram of the set enable circuit in accordance with the alternative embodiment of the present invention.

FIG. 8 is a circuit diagram of set enable circuit 702 in accordance with the alternative embodiment of the present invention. In this embodiment, a single NAND gate 704 is used to provide a select input $S_I$ through a line 214 that leads to high speed latch and power up block 710 of FIG. 7. In general, when NAND gate 704 receives a HIGH from select input SI and a HIGH from a line 218, NAND gate 704 will provide a LOW signal to high speed latch and power up block 710. When this happens, high speed latch and power up block 710 becomes SET enabled.

Figure 9:
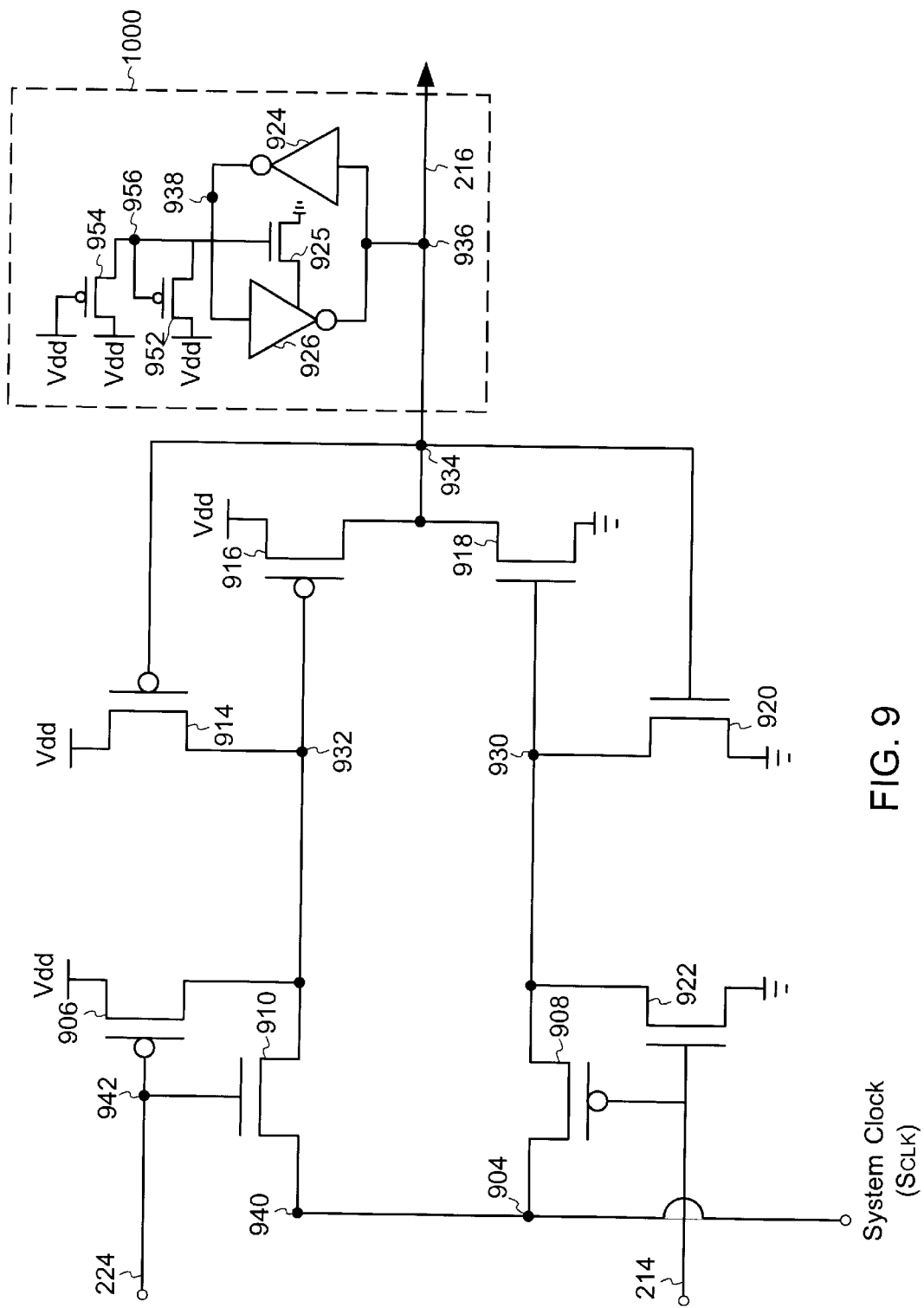
FIG. 9 is a circuit diagram illustrating preferred electrical interconnections contained within a high speed latch and power up block in accordance with the alternative embodiment of the present invention.

FIG. 9 is a circuit diagram illustrating preferred electrical interconnections contained within high speed latch and power up block 710 in accordance with an alternative embodiment of the present invention. As shown, an n-channel transistor 922 has a gate connected to a node 902, a source connected to a node 930, and a drain connected to a low rail voltage Vss. A p-channel transistor 908 has a gate connected to a node 902, a source connected to a node 904, and a drain connected to a node 930, while an n-channel transistor 920 has a gate connect to a node 934, a source connected to node 930, and a drain connected to a low rail voltage Vss.

Line 224 which defines an output of output feedback inverter 204 (of FIG. 8) is preferably connected to the gates of transistors 906 and 910 at node 942. In this embodiment, line 214 defines an output of set enable circuit 702 that is preferably connected to the gates of transistors 922 and 908 at node 902. System clock CLK is electrically connected to node 904 and a node 940 that is electrically identical to node 904.

A p-channel transistor 914 has a gate connected to node 934, a source connected to a high rail voltage Vdd, and a drain connected to a node 932. In one embodiment, p-channel transistor 914 may be omitted if a more compact design is desired. A p-channel transistor 906 has a gate connected to a node 942, a source connected to high rail voltage Vdd, and a drain connected to node 932. An n-channel transistor 910 has a gate connected to node 942, a source connected to a node 940 and a drain connected to node 932. An n-channel transistor 918 has a gate connected to node 930, a source connected to node 934, and a drain connected to low rail voltage Vss. A p-channel transistor 916 has a gate connected to node 932, a source connected to high rail voltage Vdd, and a drain connected to node 934.

An inverter 924 has an input defined by node 936 and an output defined by a node 938, while an inverter 926 has an input defined by node 938 and an output defined by node 936. In this embodiment, a source of a grounding transistor 925 is coupled to inverter 926, and the gate of grounding transistor 925 is coupled to a node 956. Node 956 preferably defines a connection to the gate and the drain of a power up transistor 952 and the drain of a voltage limiter transistor 954. The source of power up transistor 952 is coupled to a voltage source Vdd. As shown, the source and the gate of voltage limiter transistor 954 is preferably coupled to a voltage source Vdd. Once the circuit is powered up, the function of high speed addressable buffer architecture 700 is essentially the same as described with reference to FIG. 2.

In general, the advantageous power up features described with reference to power up select unit 202a of FIG. 2 are now incorporated into high speed latch and power up block 710. Accordingly, this provides for a more compact circuit arrangement which reduces the amount of space required once the circuit is implemented on silicon.

Figure 10:
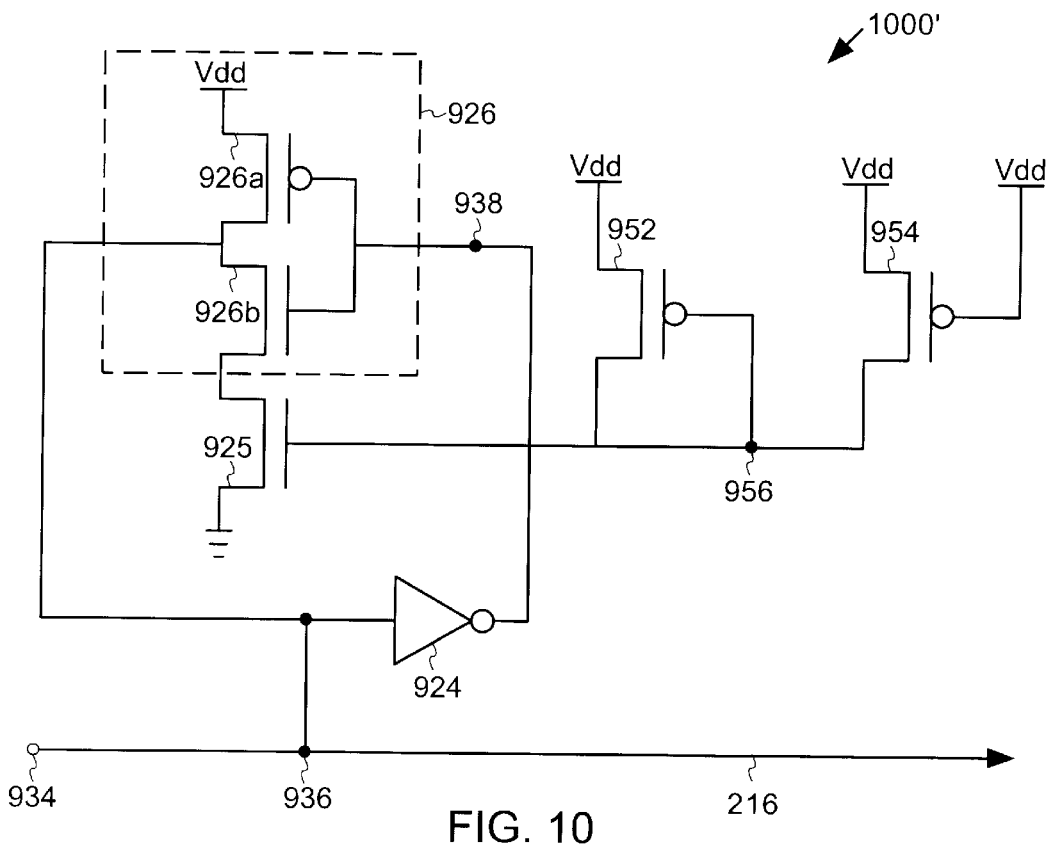
FIG. 10 is a more detailed circuit representation of the power up interconnections provided within the high speed latch and power up block of FIG. 9 in accordance with the alternative embodiment of the present invention.

FIG. 10 is a more detailed circuit representation of the power up interconnections 1000 provided within high speed latch and power up block 710 in accordance with an alternative embodiment of the present invention. Preferably, node 938 is shown coupled between an inverter transistor pair contained within inverter 926. By way of example, node 938 is coupled to the gates of a p-channel transistor 926a and an n-channel transistor 926b. The drains of p-channel transistor 926a and n-channel transistor 926b therefore defines the output of inverter 926 that leads to node 936. As described above, grounding transistor 925 has its source coupled to a source of n-channel transistor 926b, its drain connected to low rail voltage Vss, and its gate coupled to node 956. In turn, node 956 is coupled to the gate and drain of power up transistor 952 and the drain of voltage limiter transistor 954.

Figure 11:
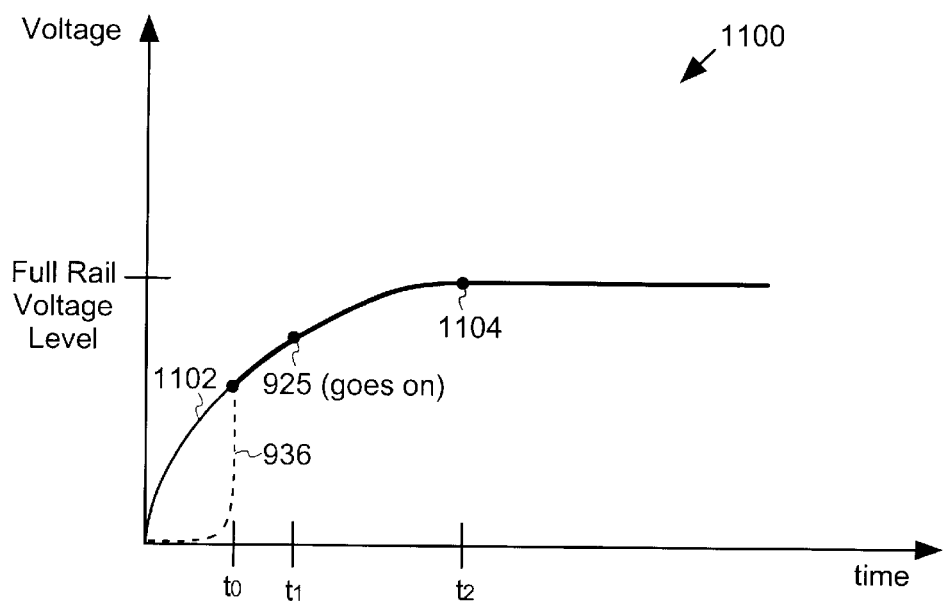
FIG. 11 is a graphical representation of the power up operation provided by the power up interconnections described in FIG. 10.

FIG. 11 is a graphical representation of the power up operation provided by the power up interconnections described in FIG. 10. A voltage and time plot is provided to facilitate the description of the power up events that occur before node 536 is powered up HIGH. Initially, when a voltage is applied to the Vdd nodes of FIG. 9, Vdd will begin to ramp up as shown by an applied voltage line 1102. At this point, p-channel transistor 926a will turn ON first because grounding transistor 925 is OFF. In general, p-channel transistor 926a can only turn ON fully when the applied voltage to the Vdd line (1102) is greater or equal to "$V_{TP}$" ($V_T$=threshold voltage). This is earlier than the grounding of n-channel transistor 926b.

As such, n-channel transistor 926b will have a delayed turn-on that does not occur until the applied voltage line 1102 reaches a voltage level that is at least two times Vt (i.e., Vtn+Vtp). At a time $t_0$, channel transistor 926b will turn ON, and node 936 is caused to rapidly rise to meet the applied voltage line 1102. At this point, node 936 and the applied voltage line 1102 will proceed together up to a final voltage level 1104 (i.e., full rail voltage level). At a time $t_1$, grounding transistor 925 is caused to shift ON by power up transistor 952. By the time grounding transistor 925 is caused to turn ON, node 936 is already HIGH, and n-channel transistor 926b is OFF because 938 is LOW once the signal is passed through inverter 924.

Grounding transistor 925 will now remain ON, and voltage limiter transistor 954 and power up transistor 952 are no longer switching. However, power up transistor 952 will preferably remain active to maintain a HIGH at node 956. Voltage limiter transistor 954 will prevent the voltage level on node 956 from floating to a higher level than "full rail voltage level+$V_{TP}$", thereby preventing unwanted defects on the gate of transistor 925 due to excess gate voltage. Accordingly, p-channel transistor 926a will preferably switch ON first, and n-channel transistor 926b will have a delayed turn-on. This will guarantee that node 936 will be HIGH when applied voltage line 1102 reaches the full rail voltage level, thereby meeting the power-up requirements of the latch.

Although the foregoing invention has been described in some detail for purposes of clarity of understanding, it will be apparent that certain changes and modifications may be practiced within the scope of the appended claims. By way of example, although the high speed memory accessing features of the various embodiments have been described with reference to synchronous memory devices, these high speed features are equally applicable to other electrical devices requiring testable, high speed access buffers.

In addition, it should be understood that the various circuits may be embodied in any form which may include, for example, any suitable semiconductor substrate, printed circuit board, or packaged integrated circuit. In addition, the various circuits may be implemented using software driven computer-implemented operations. By way of example, hardware description language (HDL) design and synthesis programs may be used to design silicon-level circuitry. By way of example, a VHDL® hardware description language available from IEEE of New York, N.Y. may be implemented to design silicon-level layouts. Accordingly, the present embodiments are to be considered as illustrative and not restrictive, and the invention is not to be limited to the details given herein, but may be modified within the scope and equivalents of the appended claims.

What is claimed is:

1. A high speed memory addressing circuit, comprising:
   a latching circuit configured to generate a first latched signal from an output node that is coupled to a first driver transistor in response to a first system clock transition;
   a first output feedback inverter configured to receive the first latched signal and output the first latched signal as an inverted first latched signal;
   a setting circuit configured to receive the inverted first latched signal, the setting circuit further configured to disable the first driver transistor in response to receiving the inverted first latched signal; and
   a second output feedback inverter for receiving the inverted first latched signal, the second output feedback inverter being configured to enable a second driver transistor at a second system clock transition to produce a second latched signal at the output node after the first driver transistor is disabled.

2. A high speed memory addressing circuit as recited in claim 1, further including a power-up core configured to maintain de-selected address locations in a low state.

3. A high speed memory addressing circuit as recited in claim 2, wherein a system clock is isolated from the de-selected address locations.

4. A high speed memory addressing circuit as recited in claim 1, further comprising an output driver coupled to the output node for inverting the first latched signal that enables reading a memory address.

5. A high speed memory addressing circuit as recited in claim 4, wherein the first latched signal is latched as a low signal in a latch circuit that is coupled between the output node and the output driver.

6. A high speed memory addressing circuit as recited in claim 4, wherein the second latched signal is latched as a high signal in a latch circuit that is coupled between the output node and the output driver.

7. A high speed memory addressing circuit as recited in claim 1, wherein the setting circuit is further configured to enable the first driver transistor contained within the latching circuit to generate the first latched signal in response to a rising edge of a system clock.

8. A high speed memory addressing circuit as recited in claim 7, wherein the setting circuit is further configured to disable the first driver transistor contained within the latching circuit from generating the first latched signal after a rising edge of the system clock.

9. A high speed memory addressing circuit as recited in claim 8, wherein when the first driver transistor is disabled, the second driver transistor is substantially simultaneously enabled to generate the second latched signal after a falling edge of the system clock.

10. A high speed memory addressing circuit as recited in claim 8, where when the first driver transistor is disabled, the system clock is isolated from the first driver transistor.

11. A high speed memory addressing circuit as recited in claim 10, wherein the system clock is substantially free of input capacitance from the first driver transistor when the first driver transistor is disabled.

12. A high speed memory addressing circuit as recited in claim 7, wherein the second output feedback inverter is further configured to disable the second driver transistor contained within the latching circuit from generating the second latched signal after a falling edge of the system clock.

13. A high speed memory addressing circuit as recited in claim 12, where when the second driver transistor is disabled, the system clock is isolated from the second driver transistor.

14. A high speed memory addressing circuit as recited in claim 13, wherein the system clock is substantially free of input capacitance from the second driver transistor when the second driver transistor is disabled.

15. A method for accessing memory locations, comprising:

generating a first latched signal in response to a first system clock transition, the first latched signal being output from a node coupled to a first transistor to access an address in a memory core;

supplying a first feedback signal configured to disable the first transistor and substantially simultaneously enable a second transistor after the first system clock transition;

generating a second latched signal in response to a second clock system transition, the second latched signal being output from the node coupled to the second transistor to isolate the memory core; and supplying a second feedback signal configured to disable the second transistor and substantially simultaneously enable the first transistor after the second system clock transition.

16. A method for accessing memory locations as recited in claim 15, wherein a system clock is isolated from a first driver transistor when the first feedback signal disables the first transistor.

17. method for accessing memory locations as recited in claim 16, wherein after the system clock is isolated from the first driver transistor by the disabling of the first transistor, the system clock is substantially free of input capacitance from the first driver transistor.

18. method for accessing memory locations as recited in claim 16, wherein the system clock is isolated from a second driver transistor when the second feedback signal disables the second transistor.

19. A method for accessing memory locations as recited in claim 18, wherein after the system clock is isolated from the second driver transistor, the system clock is substantially free of input capacitance from the second driver transistor.

20. A method for accessing memory locations as recited in claim 15, further comprising:

loading a system clock with input capacitance associated with the first transistor for a first pulse duration when the first transistor is enabled.

21. A method for accessing memory locations as recited in claim 20, further comprising:

storing the first latched signal at a beginning of the first pulse duration until the second transistor is enabled.

22. A method for accessing memory locations as recited in claim 15, further comprising:

loading a system clock with input capacitance associated with the second transistor for a first pulse duration when the second transistor is enabled.

23. A method for accessing memory locations as recited in claim 22, further comprising:

storing the second latched signal at a beginning of the first pulse duration until the first transistor is enabled.

24. An apparatus for generating a memory access signal, comprising:

a latch having a set state for driving a set transistor, and a reset state for driving a reset transistor, said latch having an input terminal and an output terminal, and said latch transitioning between the set and reset states in accordance with a system clock signal;

a driver coupled to the output terminal of said latch for producing an access signal;

a feedback path for feeding back said access signal to the input terminal of said latch;

wherein said latch operates to switch from the set state to the reset state in accordance with the fed back access signal, such that said system clock signal is isolated from the set transistor when said latch is in the set state; and wherein said latch operates to switch from the reset state to the set state in accordance with the fed back access signal, such that said system clock signal is isolated from the reset transistor when said latch is in the reset state.

25. An apparatus for generating a memory access signal as recited in claim 24, wherein the system clock signal is substantially free of input capacitance from the set transistor when in the reset state.

26. An apparatus for generating a memory access signal as recited in claim 24, wherein the system clock signal is substantially free of input capacitance from the reset transistor when in the set state.

27. An apparatus for generating a memory access signal as recited in claim 24, wherein said latch further includes a pull down switching device configured to rapidly turn off the set transistor when said latch transitions to the reset state.

28. An apparatus for generating a memory access signal as recited in claim 24, wherein said latch further includes a pull up switching device configured to rapidly turn off the reset transistor when said latch transitions to the set state.

* * * * *